(12) United States Patent
Doi et al.

(10) Patent No.: US 9,905,417 B2
(45) Date of Patent: Feb. 27, 2018

(54) COMPOSITION FOR FORMING FERROELECTRIC THIN FILM, AND METHOD FOR MANUFACTURING SAME

(71) Applicant: MITSUBISHI MATERIALS CORPORATION, Tokyo (JP)

(72) Inventors: Toshihiro Doi, Naka (JP); Hideaki Sakurai, Naka (JP); Nobuyuki Soyama, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/787,915

(22) PCT Filed: May 14, 2014

(86) PCT No.: PCT/JP2014/062821
§ 371 (c)(1),
(2) Date: Oct. 29, 2015

(87) PCT Pub. No.: WO2014/188926
PCT Pub. Date: Nov. 27, 2014

(65) Prior Publication Data
US 2016/0111277 A1    Apr. 21, 2016

(30) Foreign Application Priority Data
May 20, 2013    (JP) ................................. 2013-105780

(51) Int. Cl.
*H01L 21/02*    (2006.01)
*H01L 49/02*    (2006.01)
*C09D 133/26*    (2006.01)

(52) U.S. Cl.
CPC ...... *H01L 21/02197* (2013.01); *C09D 133/26* (2013.01); *H01L 21/02205* (2013.01); *H01L 21/02282* (2013.01); *H01L 28/55* (2013.01)

(58) Field of Classification Search
None
See application file for complete search history.

(56) References Cited

U.S. PATENT DOCUMENTS 6,247,799 B1    6/2001    Sakamaki et al.
6,336,716 B1    1/2002    Sakamaki et al.
(Continued)

FOREIGN PATENT DOCUMENTS

JP    2001-261338 A    9/2001
JP    2002-255553 A    9/2002
(Continued)

OTHER PUBLICATIONS

Office Action dated Oct. 26, 2016, issued for the Japanese patent application No. 2013-105780.
(Continued)

*Primary Examiner* — Colin W. Slifka
(74) *Attorney, Agent, or Firm* — Locke Lord LLP

(57) ABSTRACT

A composition containing a precursor of a ferroelectric thin film, a solvent, and a reaction control substance, can form a ferroelectric thin film by temporary firing and permanent firing of a coating film. The composition contains the reaction control substance in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa. Thus a thin film having high crystallinity can be formed which substantially does not crack at the time of permanent firing even if the thickness of the coating film formed per single coating operation is increased.

18 Claims, 1 Drawing Sheet

(56) References Cited

U.S. PATENT DOCUMENTS

| | | | |
|---|---|---|---|
| 6,343,855 | B1 | 2/2002 | Sakamaki et al. |
| 7,036,915 | B2 | 5/2006 | Eritate et al. |
| 2004/0132221 | A1 | 7/2004 | Kobayashi et al. |
| 2009/0162540 | A1* | 6/2009 | Golovkova ............. C04B 40/04 427/154 |
| 2013/0168597 | A1* | 7/2013 | Houbertz-Krauss .. C04B 35/468 252/62.9 PZ |

FOREIGN PATENT DOCUMENTS

| | | |
|---|---|---|
| JP | 2002-274850 A | 9/2002 |
| JP | 2004-111851 A | 4/2004 |
| JP | 2004-134768 | 4/2004 |
| JP | 2011-238708 A | 11/2011 |
| WO | WO-1998/011613 A1 | 3/1998 |
| WO | 2005/085496 A2 | 9/2005 |

OTHER PUBLICATIONS

A. Yamano et al., "Single-step sol-gel deposition and dielectric properties of 0.4 μm thick, (001) oriented Pb(Zr, Ti)O$_3$ thin films," J Sol-Gel Sci Technol (2008) 47:316-325.
International Search Report dated Aug. 26, 2014, issued for PCT/JP2014/062821.
European Patent Office Communication, European Search Report on corresponding EP14800755, dated Nov. 30, 2016.

* cited by examiner

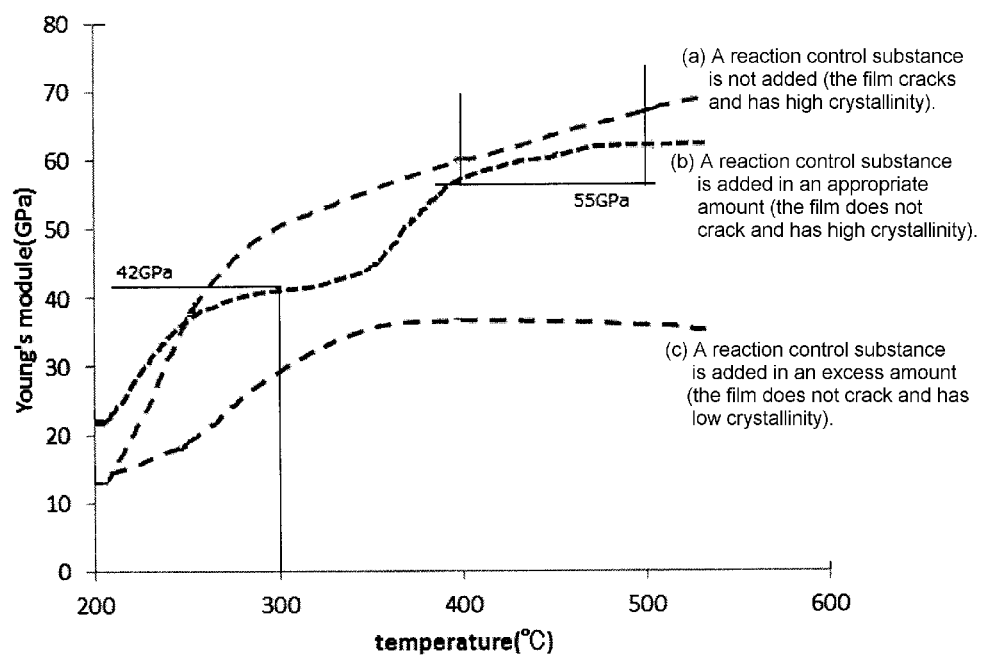

COMPOSITION FOR FORMING FERROELECTRIC THIN FILM, AND METHOD FOR MANUFACTURING SAME

TECHNICAL FIELD

The present invention relates to a composition (sol-gel liquid) for forming a ferroelectric thin film based on PZT or the like, which makes it possible to obtain a thin film with high crystallinity that substantially does not crack at the time of permanent firing even if the thickness of a coating film formed per single coating operation is increased and thus makes it possible to increase the manufacturing efficiency of a thin film by reducing the number of times of the coating operation. The present invention also relates to a method for manufacturing the composition for forming a ferroelectric thin film.

BACKGROUND ART

In a case of forming a ferroelectric thin film, which is used in a dielectric layer such as a thin film capacitor, by a sol-gel method, a manufacturing process is adopted in which a substrate is coated with a sol-gel liquid for forming the thin film, and the coating film is subjected to temporary firing and permanent firing. In this case, if the amount of the sol-gel liquid used for a single coating operation is increased so as to obtain a thicker film, the tensile stress occurring in the film at the time of permanent firing or the like increases, and this leads to a problem in that cracks are generated in the thin film after permanent firing.

If there are cracks in the formed thin film, the electrical characteristics and the like thereof deteriorate. Therefore, conventionally, in the sol-gel method, the thickness of the film that can be formed by a single coating operation is limited to about 100 nm. In order to form a thick ferroelectric thin film, coating, permanent firing, and the like of the composition are repeatedly performed plural times, and therefore, the manufacturing efficiency of the thin film is reduced, and the costs increase.

Therefore, conventionally, a raw material liquid that can form a thick coating film by a single coating operation has been examined. For example, Patent Document discloses that by adding propylene glycol to a raw material liquid forming a Ti-containing metal oxide thin film, it is possible to form a thin film which does not crack even if a thick film having a thickness of equal to or greater than 0.2 µm is formed by a single coating operation. Furthermore, Non-Patent Document 1 discloses that by adding a polymer compound to a high concentration sol-gel liquid for forming a ferroelectric thin film, the tensile stress occurring during the film formation is released, and therefore, it is possible to form a thin film without cracking the film even if the thickness of the coating film formed by a single coating operation is increased.

In addition, regarding a composition for forming a metal oxide thin film using a metal alkoxide, a method is known in which a hydrophilic polymer such as polyvinyl pyrrolidone (PVP) or polyvinyl acetamide (PNVA) is added to a solvent containing a chelate such as acetic acid, and the obtained composition is used to form a thin film having a thickness of equal to or greater than 0.5 µm by a single coating operation (Patent Documents 2 and 3).

RELATED ART DOCUMENT

Patent Document

Patent Document 1: JP-A-2001-261338
Patent Document 2: JP-A-2002-255553
Patent Document 3: JP-A-2002-274850

Non-Patent Document

Non-Patent Document 1: J Sol-Gel Sci Technol (2008) 47:316-325

DISCLOSURE OF THE INVENTION

Problem that the Invention is to Solve

The use of the raw material liquid, to which the highly viscous diol described in Patent Document 1 is added, or the raw material liquid, to which the polymer compound described in Non-Patent Document 1 is added, leads to problems in that voids are easily formed during the film formation, and a high-quality ferroelectric thin film is not easily obtained.

Furthermore, because the conventional technique that uses PVP or PNVA is a technique of forming a thick film by adjusting the viscosity of the liquid by using PVP or PNVA together with a chelating agent such as acetic acid, the effect of such a technique is unclear in solvents not containing acetic acid or the like. Moreover, the amount of PVP or PNVA used in this technique is greater than that of a metal alkoxide by at least 0.2-fold in terms of number of moles and except for inhibition of cracking, the technique is insufficient for achieving crystallinity.

Specifically, even though the viscosity of the liquid is adjusted by using PVP or PNVA together with a chelating agent such as acetic acid, if the internal stress of the film is not sufficiently released in a step of temporarily firing the film formed by coating, the film easily cracks. In addition, if the film does not have a sufficient hardness in a step of permanently firing the film, a film having high crystallinity is not obtained. As described so far, although the conventional technique forms a thick coating film by adjusting the viscosity of the raw material liquid forming a ferroelectric thin film, even if the viscosity of the raw material liquid is adjusted, it is difficult to sufficiently inhibit cracking.

In the present invention, instead of the conventional technique of adjusting the viscosity of the raw material liquid, a method of adding a substance (reaction control substance), which controls a reaction of forming a ferroelectric structure by bringing oxygen into metal components of a raw material liquid of a ferroelectric thin film at the time of permanent firing of the metal components, to the raw material liquid is used, and in this way, a Young's modulus of the formed film is adjusted through a step of temporary firing and a step of permanent firing. In this manner, the present invention provides a composition for forming a ferroelectric thin film that makes it possible to obtain a thin film having high crystallinity by sufficiently inhibiting the occurrence of cracks even if the thickness of the coating film formed per single coating operation is increased. Furthermore, the present invention also provides a method for manufacturing the composition for forming a ferroelectric thin film.

The present invention provides a composition for forming a ferroelectric thin film and a method for manufacturing the composition that have solved the above problem with the following constitution.

[1] A composition for forming a ferroelectric thin film that forms a ferroelectric thin film by temporary firing and permanent firing of a coating film, including: a precursor of the ferroelectric thin film; a solvent; and a reaction control substance, in which the reaction control substance is contained in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa.

[2] The composition for forming a ferroelectric thin film according to above [1], in which the reaction control substance is polyvinyl pyrrolidone (PVP), polyacrylamide, or polyvinyl acetamide.

[3] The composition for forming a ferroelectric thin film according to above [1] or [2], in which the reaction control substance is contained in an amount of 0.0025 mol to 0.25 mol with respect to 1 mol of the precursor of the ferroelectric thin film.

[4] The composition for forming a ferroelectric thin film according to any one of above [1] to [3] that is a composition for forming a PZT thin film, in which the precursor of PZT is contained in an amount of 17% by mass to 35% by mass expressed in terms of an oxide, a diol as the solvent is contained in an amount of 16% by mass to 56% by mass, and the reaction control substance is contained in an amount of 0.0025 mol to 0.25 mol with respect to 1 mol of the precursor of the PZT.

[5] A method for manufacturing a composition for forming a ferroelectric thin film, including: forming a precursor liquid of a ferroelectric thin film by putting raw materials of metal components of the ferroelectric thin film and a diol as a solvent into a reaction container and heating the raw materials and the solvent under reflux in an inert atmosphere; adding a reaction control substance to the precursor liquid, in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa; stirring and mixing the precursor liquid and the reaction control substance together; and adding the solvent thereto such that the concentration of a precursor of the ferroelectric thin film is adjusted to be 17% by mass to 35% by mass expressed in terms of an oxide.

[6] A method for manufacturing a ferroelectric thin film by using the composition for forming a ferroelectric thin film according to any one of above [1] to [4].

DETAILED DESCRIPTION

The composition for forming a ferroelectric thin film of the present invention is a composition which contains a precursor of a ferroelectric thin film, a solvent, and a reaction control substance and forms a ferroelectric thin film by temporary firing and permanent firing of a coating film. The reaction control substance is contained in the composition in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa.

In the composition of the present invention, the ferroelectric material is, for example, lead zirconate titanate (PZT). The PZT ferroelectric material is a composite metal oxide having a perovskite structure represented by Formula $Pb(Zr_xTi_{1-x})O_3$ (0<x<1), and has a high dielectric constant, piezoelectric properties, and ferroelectric properties.

The ferroelectric material of the present invention includes PMnZT obtained by adding a Mn element to PZT, PNbZT obtained by adding a Nb element to PZT, PLaZT obtained by adding a La element to PZT, and the like. Hereinafter, the present invention will be described by using a PZT ferroelectric material as an example.

The composition for forming a PZT ferroelectric material is a sol-gel liquid (PZT precursor liquid) containing a PZT precursor forming a PZT thin film. A substrate is coated with the PZT precursor liquid, the coating film is temporarily fired so as to accelerate the decomposition and bonding of metal components and to accelerate the incorporation of oxygen into the metal components, the coating film is then subjected to permanent firing, and in this way, a crystalline PZT thin film is formed.

The PZT precursor is obtained by mixing together raw materials of metal elements such as Pb, Zr, and Ti at such a quantitative ratio that a PZT ferroelectric material is formed. As such raw materials, metal compounds to which an organic group is bonded through an oxygen or nitrogen atom thereof are preferably used. For example, it is possible to use one kind of compound or two or more kinds of compounds selected from the group consisting of a metal alkoxide, a metal diol complex, a metal triol complex, a metal carboxylate, a metal β-diketonate complex, a metal β-diketoester complex, a metal β-iminoketo complex, and a metal amino complex. Among these compounds, a metal alkoxide, a partial hydrolysate thereof, and an organic acid salt thereof are particularly preferable.

The raw materials of the metal elements such as Pb, Zr, and Ti as well as a solvent are put into a reaction container and heated under reflux in an inert atmosphere, thereby forming the PZT precursor liquid. The raw materials of the metal elements are mixed together at such a quantitative ratio that the metal elements form the PZT ferroelectric material.

The concentration of the PZT precursor in the composition is preferably 17% by mass to 35% by mass, and more preferably 20% by mass to 25% by mass expressed in terms of the concentration of an oxide. If the concentration of the PZT precursor is less than 17% by mass, a sufficient film thickness cannot be obtained, and if it exceeds 35% by mass, cracks easily occur.

As the solvent, it is possible to use (A) a diol such as propylene glycol, ethylene glycol, or 1,3-propanediol. By using a diol as the solvent, the storage stability of the composition can be improved.

As other solvents, it is possible to use (B) carboxylic acid, an alcohol other than a diol, ester, ketones (for example, acetone and methyl ethyl ketone), ethers (for example, dimethyl ether and diethyl ether), cycloalkanes (for example, cyclohexane and cyclohexanol), aromatic solvents (for example, benzene, toluene, and xylene), tetrahydrofuran, and the like.

When an alcohol is used as the solvent, from the viewpoint of coating properties and drying properties of the liquid, a linear monoalcohol having 1 to 4 carbon atoms is preferable for the purpose of dilution. For the purpose of forming a dense film, a linear monoalcohol having 6 to 12 carbon atoms may be used together with a linear monoalcohol having 1 to 4 carbon atoms. If these solvents are used, it is possible to form a gel film that can effectively release an organic substance out of the film at the time of temporary firing, and to obtain a high-performance dense PZT film even when the thickness of the coating film is increased. If an alcohol having less than 6 carbon atoms is used alone, the boiling point is not high enough, and therefore the film is not sufficiently densified. In contrast, if the number of carbon atoms exceeds 12, the solubility thereof in the sol-gel liquid is low, and therefore it is difficult to dissolve the solvent in a sufficient amount. Furthermore, the viscosity of the liquid becomes too high, and thus the substrate cannot be uniformly coated with the liquid.

The composition of the present invention can contain a polar solvent like a formamide-based solvent such as formamide, N-methylformamide, or N,N-dimethylformamide. If the formamide-based solvent or the like is concurrently used, it is possible to further inhibit cracking and to form a dense film.

When the diol is used as the solvent, the amount of the diol in the composition is preferably 16% by mass to 56% by mass for the following reason. If the amount of the diol is less than 16% by mass, the storage stability deteriorates, and in contrast, if the amount of the diol is greater than 56% by mass, voids are easily generated in the film.

The composition of the present invention preferably contains water such as deionized water or ultrapure water. If the composition contains water in a predetermined amount, the PZT precursor is appropriately hydrolyzed, and thus an effect of increasing the density of the film is obtained. The amount of water is preferably 0.5 mol to 3 mol, and more preferably 0.8 mol to 2 mol with respect to 1 mol of the PZT precursor. If the amount of water is less than 0.5 mol, the PZT precursor is not sufficiently hydrolyzed, and the film is not sufficiently densified. In contrast, if the amount of water exceeds 3 mol, the PZT precursor is excessively hydrolyzed, and accordingly, sedimentation occurs, and cracks easily occur in the film.

The composition of the present invention contains the reaction control substance together with the precursor of a ferroelectric thin film such as PZT and the solvent. The reaction control substance is a substance that controls a reaction of forming a ferroelectric structure by bringing oxygen into metal components at the time of permanent firing. If the composition contains the reaction control substance, the Young's modulus of the coating film formed at the time of temporary firing or at the time of permanent firing is controlled. Specifically, the composition of the present invention is a composition which is controlled such that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa.

As the reaction control substance, polyvinyl pyrrolidone, polyacrylamide, or polyvinyl acetamide can be used. The reaction control substance is contained in the composition, in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa.

Specifically, for example, the amount of the reaction control substance such as polyvinyl pyrrolidone, polyacrylamide, or polyvinyl acetamide contained in the composition is preferably 0.0025 mol to 0.25 mol and more preferably 0.0025 mol to 0.2 mol, with respect to 1 mol of the PZT precursor. If the amount of the reaction control substance contained in the composition is less than an appropriate amount, the Young's modulus of a film formed in a step of temporary firing at a temperature of 200° C. to 300° C. becomes greater than 42 GPa, and the internal stress of the film is not sufficiently released. Accordingly, cracks easily occur. In contrast, if the amount of the reaction control substance contained in the composition is greater than an appropriate amount, the Young's modulus of a film formed in a step of permanent firing at a temperature of 400° C. to 500° C. becomes less than 55 GPa. Accordingly, a dense thin film having high crystallinity cannot be obtained.

According to Patent Documents 1 and 2, in the conventional techniques that use polyvinyl pyrrolidone or polyacrylamide, the amount of the polyvinyl pyrrolidone or the like may be greater than that of a metal alkoxide by 0.2-fold to 1.5-fold in terms of number of moles, and is preferably greater than that of a metal alkoxide by 0.3-fold to 1-fold in terms of number of moles. However, if the polyvinyl pyrrolidone or the like is used in such a large amount, although the cracking of a film is inhibited, a film having high crystallinity cannot be obtained.

The composition for forming a ferroelectric thin film (containing the ferroelectric precursor in an amount of 17% by mass to 35% by mass expressed in terms of an oxide, a diol as the solvent in an amount of 16% by mass to 56% by mass, and water in an amount of 0.5 mol to 3 mol with respect to 1 mol of the ferroelectric precursor) is classified into (a) a composition not containing the reaction control substance, (b) a composition containing the reaction control substance in an appropriate amount, and (c) a composition containing the reaction control substance in an excess amount. By using these compositions, a coating film is formed, the coating film is fired at a temperature of 200° C. to 500° C., and the change of the Young's modulus of the film formed at this time is shown in FIG. 1.

As shown in the drawing, due to the reaction control substance, the Young's modulus of the formed film changes as below.

When a coating film was formed by using the (a) composition for forming a PZT ferroelectric thin film not containing the reaction control substance, within a range of 200° C. to 300° C., the Young's modulus of the formed film substantially linearly increases to about 55 GPa in proportion to the firing temperature, and when the temperature becomes equal to or higher than about 330° C., the Young's modulus gradually increases.

When a coating film is formed by using the (b) composition for forming a PZT ferroelectric thin film containing the reaction control substance in an appropriate amount, within a range of 200° C. to about 280° C., the Young's modulus of the formed film substantially linearly increases to about 35 GPa in proportion to the firing temperature. However, within a range of about 280° C. to about 350° C., the Young's modulus is substantially constant, and within a range of about 350° C. to about 400° C., the Young's modulus substantially linearly increases again. When the temperature becomes equal to or higher than about 450° C., the Young's modulus increases to about 55 GPa.

When a coating film is formed by using the (c) composition for forming a PZT ferroelectric thin film containing the reaction control substance in an excess amount, within a range of about 250° C. to about 300° C., the Young's modulus of the formed film substantially linearly increases to about 35 GPa in proportion to the firing temperature. However, when the temperature becomes equal to or higher than about 400° C., the Young's modulus does not increase and tends to slightly decrease.

In the case of the composition (a), the Young's modulus increases to about 55 GPa, and therefore a dense film is formed of the composition (a). However, because the Young's modulus rapidly increases in the step of temporary firing at a temperature of 250° C. to 300° C., cracks easily occur. In the case of the composition (c), the Young's modulus just increases to about 25 GPa. Therefore, in the film formed of the composition (c), a bond between the metal and oxygen is not sufficiently formed, the crystallinity is low, the film becomes porous, and accordingly, a dense thin film cannot be obtained. When the Young's modulus of the formed film is less than 50 GPa, a bond between a metal and oxygen in the film is not sufficiently formed, and a film having low crystallinity is obtained.

In contrast, in the case of the composition (b), after increasing in the step of temporary firing at a temperature of about 200° C. to about 250° C., the Young's modulus is substantially constant until the temperature becomes about 350° C. Consequently, the film sufficiently undergoes elastic deformation or plastic deformation, the internal stress of the film is sufficiently released, and therefore cracks do not easily occur. In addition, when the firing temperature becomes equal to or higher than about 390° C., the Young's modulus substantially linearly increases again to about 55 GPa, and therefore a dense thin film having high crystallinity can be obtained.

The change of the Young's modulus of the coating film, which is formed by using the conventional composition for forming a ferroelectric thin film not containing the reaction control substance, from the step of temporary firing to the step of permanent firing generally shows the same trend as that of the composition (a) of FIG. 1.

The Young's modulus of the coating film formed by using the composition for forming a ferroelectric thin film disclosed in Patent documents 1 and 2 is 13 GPa to 30 GPa in the step of temporary firing at a temperature of 200° C. to 300° C. and is 28 GPa to 45 GPa in the step of permanent firing at a temperature of 400° C. to 500° C., showing the tendency similar to that of the composition (c) of FIG. 1.

As described above, because the composition for forming a ferroelectric thin film of the present invention contains the reaction control substance in an appropriate amount, it is possible to obtain a thin film having high crystallinity in which cracking is sufficiently inhibited. Specifically, for example, as a composition for forming a PZT thin film, those composed as below are preferable.

(a) A composition for forming a PZT ferroelectric thin film which contains a PZT precursor in an amount of 17% by mass to 35% by mass expressed in terms of an oxide, a diol as a solvent in an amount of 16% by mass to 56% by mass, water in an amount of 0.5 mol to 3 mol with respect to 1 mol of the PZT precursor, and polyvinyl pyrrolidone in an amount of 0.0025 mol to 0.25 mol with respect to 1 mol of the PZT precursor.

(b) A composition for forming a PZT ferroelectric thin film which contains a PZT precursor in an amount of 17% by mass to 35% by mass expressed in terms of an oxide, a diol as a solvent in an amount of 16% by mass to 56% by mass, water in an amount of 0.5 mol to 3 mol with respect to 1 mol of the PZT precursor, and polyacrylamide in an amount of 0.0025 mol to 0.25 mol with respect to 1 mol of the PZT precursor.

(c) A composition for forming a PZT ferroelectric thin film which contains a PZT precursor in an amount of 17% by mass to 35% by mass expressed in terms of an oxide, a diol as a solvent in an amount of 16% by mass to 56% by mass, water in an amount of 0.5 mol to 3 mol with respect to 1 mol of the PZT precursor, and polyvinyl acetamide in an amount of 0.0025 mol to 0.25 mol with respect to 1 mol of the PZT precursor.

A ferroelectric thin film is formed by using the composition for forming a ferroelectric thin film of the present invention. For example, a ferroelectric thin film can be formed in a manner in which a liquid of the composition for forming a ferroelectric thin film of the present invention is dropped onto the surface of a substrate, a coating film is formed by a spin coater or other appropriate means, and the coating film is heated and fired.

Advantage of the Invention

The composition for forming a ferroelectric thin film of the present invention contains a precursor of a ferroelectric thin film, a solvent, and a reaction control substance. The reaction control substance is contained in the composition in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa. Therefore, in the step of temporary firing, the film sufficiently undergoes elastic deformation or plastic deformation, and thus the internal stress of the film is sufficiently released. Consequently, cracks do not easily occur, and the film has a high Young's modulus that is equal to or greater than about 50 GPa. As a result, a dense thin film having high crystallinity can be obtained.

BRIEF DESCRIPTION OF THE DRAWINGS

FIG. 1 is a graph showing the change of a Young's modulus of a formed film that is obtained when a coating film formed of a composition for forming a PZT ferroelectric thin film is fired at a temperature of 200° C. to 500° C.

BEST MODE FOR CARRYING OUT THE INVENTION

Hereinafter, examples and comparative examples of the present invention will be described. The Young's modulus of the formed film was measured by a nanoindentation method (model number: ENT-1100a manufactured by ELIONIX INC). The crystallinity of the film was measured by XRD analysis (model number: Empyrean manufactured by PANalytical B.V.).

Example 1

Lead acetate trihydrate, titanium (iv) tetraisopropoxide, zirconium (iv) tetrabutoxide, acetyl acetone, and propylene glycol were weighed, then put into a reaction container, and subjected to reflux at a temperature of 150° C. for 1 hour in a nitrogen atmosphere. After reflux, unreacted substances were removed by distillation under reduced pressure. After the resultant was cooled at room temperature, water was added thereto in an amount of 0.5 mol to 3 mol with respect to 1 mol of the PZT precursor, and the resultant was subjected to reflux at a temperature of 150° C. for 1 hour. The resultant was cooled to room temperature, thereby preparing a PZT precursor liquid forming $Pb(Zr_xTi_{1-x})O_3$ (x=0.52). To the PZT precursor liquid, PVP was added in an amount of 0.0025 mol to 0.25 mol expressed in terms of a monomer with respect to 1 mol of the PZT precursor, and the resultant was stirred for 24 hours at room temperature. After stirring, ethanol, 1-butanol, and 1-octanol were added thereto so as to dilute the liquid until the concentration of the PZT precursor became 25% by mass expressed in terms of an oxide. The obtained liquid was dropped onto the surface of a Si/SiO2/TiOx/Pt substrate, and a coating film was formed by using a spin coater at 1,500 rpm for 60 seconds. The coating film was heated and fired to a temperature of 200° C. to 500° C., thereby forming a PZT thin film. In the process of heating, the Young's modulus of the film was measured by using a nanoindenter under a load of 20 mg. Furthermore, by using an optical microscope, whether or not the film had cracks was observed, and the crystallinity of the film was evaluated by XRD analysis. The results are shown in Table 1. In the table, "O" in the column of crystallinity signifies that the crystallinity of the film is high, and "X" signifies that the crystallinity of the film is low.

Comparative Example 1

A PZT thin film was formed in the same manner as in the example 1, except that PVP was added in an amount of 0 mol, 0.002 mol, 0.27 mol, and 0.35 mol respectively expressed in terms of a monomer with respect to 1 mol of the PZT precursor. In the process of heating, the Young's modulus of the film was measured by using a nanoindenter under a load of 20 mg. Furthermore, by using an optical microscope, whether or not the film had cracks was observed, and the crystallinity of the film was evaluated by XRD analysis. The results are shown in Table 1.

As shown in Table 1, in the examples (A1 to A5) in which the composition of the present invention is used, the Young's modulus of the film formed in the step of temporary firing at a temperature of 300° C. is equal to or less than 42 GPa (31 GPa to 42 GPa), the young's modulus of the film formed in the step of permanent firing at a temperature of 450° C. is equal to or greater than 55 GPa (54 GPa to 60 GPa), and a PZT thin film without cracks that has high crystallinity is obtained. In contrast, in the comparative examples (B1 to B4), both the Young's modulus of the film formed in the step of temporary firing at a temperature of 300° C. and the Young's modulus of the film formed in the step of permanent firing at a temperature of 450° C. are out of the range of the present invention. Accordingly, cracks occur in the film of B1 and B2, and the crystallinity of the film of B3 and B4 is low.

TABLE 1

| | Amount of PVP added (mol) | Young's modulus at a temperature of 300° C. (GPa) | Young's modulus at a temperature of 450° C. (GPa) | Crack | Crystallinity |
|---|---|---|---|---|---|
| A1 | 0.0025 | 42 | 60 | Absent | O |
| A2 | 0.0250 | 38 | 58 | Absent | O |
| A3 | 0.0500 | 36 | 54 | Absent | O |
| A4 | 0.1000 | 35 | 54 | Absent | O |
| A5 | 0.2500 | 31 | 50 | Absent | O |
| B1 | 0 | 51 | 62 | Present | O |
| B2 | 0.0020 | 46 | 60 | Present | O |
| B3 | 0.2700 | 25 | 47 | Absent | X |
| B4 | 0.3500 | 22 | 30 | Absent | X |

(Note)
A1 to A5 are examples, and B1 to B4 are comparative examples.

The amount of PVP added is a mole number with respect to 1 mol of the PZT precursor.

Example 2

The composition liquid (A2 of Table 1) obtained in Example 1 was dropped onto the surface of a Si/SiO2/TiOx/Pt/60 nm-(100)-PZT substrate, and a coating film was formed by using a spin coater at 2,500 rpm for 60 seconds. The substrate on which the coating film was formed was dried for 2 minutes on a hot plate at a temperature of 75° C., and the coating film was temporarily fired at a temperature of 300° C. for 5 minutes. After the coating film was further subjected to temporary firing at a temperature of 450° C. for 5 minutes, the same operation as described above was repeated such that two layers of coating films were laminated on each other. The obtained temporarily fired film was heated to 700° C. by RTA at a heating rate of 50° C./s and then held as is for 1 minute, thereby crystallizing the temporarily fired film. This operation was repeated 5 times. The obtained PZT thin film was measured by a spectral ellipsometer (model number: M-2000 manufactured by J. A. Woollam Co., Inc.), and as a result, it was confirmed that the PZT film had a thickness of 2,060 nm. Furthermore, through optical microscopy, the PZT thin film was confirmed to be a film not having a crack. In addition, as a result of observing the cross section thereof by an SEM (model number: S-4300 manufactured by Hitachi, Ltd.), the PZT thin film was confirmed to have a dense columnar structure.

Example 3

A PZT thin film was formed in the same manner as in the example 1, except that polyacrylamide was added in an amount of 0.0025 mol to 0.25 mol expressed in terms of a monomer with respect to 1 mol of the PZT precursor. In the process of heating, the Young's modulus of the film was measured by a nanoindenter under a load of 20 mg. Furthermore, by using an optical microscope, whether or not the film had cracks was observed, and the crystallinity of the film was evaluated by XRD analysis. The results are shown in Table 2.

As shown in Table 2, in the examples (C1 to C5) using the composition of the present invention, the Young's modulus of the film formed in the step of temporary firing at a temperature of 300° C. is equal to or less than 42 GPa (26 Gpa to 41 GPa), the Young's modulus of the film formed in the step of permanent firing at a temperature of 450° C. is equal to or greater than 55 GPa (55 GPa to 61 GPa), and a PZT thin film without cracks that has high crystallinity is obtained.

TABLE 2

| | Amount of polyacrylamide added (mol) | Young's modulus at a temperature of 300° C. (GPa) | Young's modulus at a temperature of 450° C. (GPa) | Crack | Crystallinity |
|---|---|---|---|---|---|
| C1 | 0.0025 | 41 | 60 | Absent | O |
| C2 | 0.0250 | 37 | 61 | Absent | O |
| C3 | 0.0500 | 32 | 57 | Absent | O |
| C4 | 0.1000 | 30 | 55 | Absent | O |
| C5 | 0.2500 | 26 | 56 | Absent | O |
| D1 | 0.0020 | 51 | 62 | Present | O |
| D2 | 0.27 | 22 | 48 | Absent | X |

(Note)
C1 to C5 are examples, and D1 and D2 are comparative examples.

The amount of polyacrylamide added is expressed as the number of moles with respect to 1 mol of the PZT precursor.

Example 4

A PZT thin film was formed in the same manner as in the example 1, except that polyvinyl acetamide was added in an amount of 0.0025 mol to 0.25 mol expressed in terms of a monomer with respect to 1 mol of the PZT precursor. In the process of heating, the Young's modulus of the film was measured by a nanoindenter under a load of 20 mg. Furthermore, by using an optical microscope, whether or not the film had cracks was observed, and the crystallinity of the film was evaluated by XRD analysis. The results are shown in Table 3.

As shown in Table 3, in the examples (D1 to D5) in which the composition of the present invention is used, the Young's modulus of the film formed in the step of temporary firing at a temperature of 300° C. is equal to or less than 42 GPa (26 Gpa to 41 GPa), the Young's modulus of the film formed in the step of permanent firing at a temperature of 450° C. is equal to or greater than 55 GPa (55 GPa to 61 GPa), and a PZT thin film without cracks that has high crystallinity is obtained.

TABLE 3

| | Amount of polyvinyl acetamide added (mol) | Young's modulus at a temperature of 300° C. (GPa) | Young's modulus at a temperature of 450° C. (GPa) | Crack | Crystallinity |
|---|---|---|---|---|---|
| E1 | 0.0025 | 40 | 58 | Absent | ○ |
| E2 | 0.0250 | 35 | 61 | Absent | ○ |
| E3 | 0.0500 | 31 | 60 | Absent | ○ |
| E4 | 0.1000 | 26 | 59 | Absent | ○ |
| E5 | 0.2500 | 23 | 56 | Absent | ○ |
| F1 | 0.0020 | 49 | 62 | Present | ○ |
| F2 | 0.27 | 20 | 46 | Absent | X |

(Note)
E1 to E5 are examples, and F1 and F2 are comparative examples.

The amount of polyvinyl acetamide added is expressed as the number of moles with respect to 1 mol of the PZT precursor.

The invention claimed is:

1. A composition for forming a ferroelectric thin film that forms a ferroelectric thin film by temporary firing and permanent firing of a coating film, comprising:
   a precursor of the ferroelectric thin film;
   a solvent; and
   a reaction control substance,
   wherein the reaction control substance is polyacrylamide or polyvinyl acetamide,
   wherein the reaction control substance is contained in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa.

2. The composition for forming a ferroelectric thin film according to claim 1,
   wherein the solvent is a diol.

3. The composition for forming a ferroelectric thin film according to claim 2, wherein the diol is selected from a group consisting of propylene glycol, ethylene glycol, 1,3-propanediol, and mixtures thereof.

4. The composition for forming a ferroelectric thin film according to claim 1,
   wherein the solvent is an alcohol comprising a liner monoalcohol having 1 to 4 carbon atoms and a liner monoalcohol having 6 to 12 carbon atoms.

5. The composition for forming a ferroelectric thin film according to claim 1,
   wherein the reaction control substance is contained in an amount of 0.0025 mol to 0.25 mol with respect to 1 mol of the precursor of the ferroelectric thin film.

6. The composition for forming a ferroelectric thin film according to claim 5 that is a composition for forming a PZT thin film,
   wherein the precursor of PZT is contained in an amount of 17% by mass to 35% by mass expressed in terms of an oxide,
   a diol as the solvent is contained in an amount of 16% by mass to 56% by mass, and
   the reaction control substance is contained in an amount of 0.0025 mol to 0.25 mol with respect to 1 mol of the precursor of the PZT.

7. The composition for forming a ferroelectric thin film according to claim 5 that is a composition for forming a PZT thin film,
   wherein the precursor of PZT is contained in an amount of 17% by mass to 35% by mass expressed in terms of an oxide,
   a diol as the solvent is contained in an amount of 16% by mass to 56% by mass,
   the reaction control substance is contained in an amount of 0.0025 mol to 0.25 mol with respect to 1 mol of the precursor of the PZT, and
   water is contained in an amount of 0.5 mol to 3 mol with respect to 1 mol of the PZT precursor.

8. The composition for forming a ferroelectric thin film according to claim 1 that is a composition for forming a PZT thin film,
   wherein the precursor of PZT is contained in an amount of 17% by mass to 35% by mass expressed in terms of an oxide,
   a diol as the solvent is contained in an amount of 16% by mass to 56% by mass, and
   the reaction control substance is contained in an amount of 0.0025 mol to 0.25 mol with respect to 1 mol of the precursor of the PZT.

9. The composition for forming a ferroelectric thin film according to claim 1,
   wherein the composition does not contain a chelating agent.

10. A composition for forming a ferroelectric thin film is consisting of:
    a precursor of the ferroelectric thin film;
    a solvent; and
    a reaction control substance,
    wherein the reaction control substance is contained in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa.

11. A method for manufacturing a composition for forming a ferroelectric thin film, comprising:
    forming a precursor liquid of a ferroelectric thin film by putting raw materials of metal components of the ferroelectric thin film and a diol as a solvent into a reaction container and heating the raw materials and the solvent under reflux in an inert atmosphere;
    adding a reaction control substance to the precursor liquid, in such an amount that a Young's modulus of a film formed in a step of temporary firing at a temperature of 200° C. to 300° C. becomes equal to or less than 42 GPa, and a Young's modulus of a film formed in a step of permanent firing at a temperature of 400° C. to 500° C. becomes equal to or greater than 55 GPa;

stirring and mixing the precursor liquid and the reaction control substance together; and adding the solvent thereto such that the concentration of a precursor of the ferroelectric thin film is adjusted to be 17% by mass to 35% by mass expressed in terms of an oxide.

12. A method for manufacturing a ferroelectric thin film by using the composition for forming a ferroelectric thin film according to claim 1.

13. A method for manufacturing a ferroelectric thin film by using the composition for forming a ferroelectric thin film according to claim 2.

14. A method for manufacturing a ferroelectric thin film by using the composition for forming a ferroelectric thin film according to claim 4.

15. A method for manufacturing a ferroelectric thin film by using the composition for forming a ferroelectric thin film according to claim 5.

16. A method for manufacturing a ferroelectric thin film by using the composition for forming a ferroelectric thin film according to claim 6.

17. A method for manufacturing a ferroelectric thin film by using the composition for forming a ferroelectric thin film according to claim 7.

18. A method for manufacturing a ferroelectric thin film by using the composition for forming a ferroelectric thin film according to claim 8.

* * * * *